United States Patent [19]

Reinecke

[11] Patent Number: 5,631,303
[45] Date of Patent: May 20, 1997

[54] PROCESS FOR REMOVING PLASTICS FROM MICROSTRUCTURES

[75] Inventor: Holger Reinecke, Dortmund, Germany

[73] Assignee: MicroParts, Dortmund, Germany

[21] Appl. No.: 559,765

[22] Filed: Nov. 15, 1995

Related U.S. Application Data

[63] Continuation of Ser. No. 190,493, Feb. 2, 1994, abandoned.

[30] Foreign Application Priority Data

Feb. 10, 1993 [DE] Germany ............ 43 03 923.5

[51] Int. Cl.$^6$ .................... C08J 11/04; B08B 7/04
[52] U.S. Cl. ............... 521/40.5; 134/10; 134/38; 264/344
[58] Field of Search ............... 252/143, 364; 134/10, 38; 264/344; 521/40.5

[56] References Cited

U.S. PATENT DOCUMENTS

| | | |
|---|---|---|
| 3,873,361 | 3/1975 | Franco et al. |
| 4,111,715 | 9/1978 | Sprengling ............ 134/10 |
| 4,165,294 | 8/1979 | Vander Mey. |
| 4,312,672 | 1/1982 | Blahak et al. ............ 252/56 |
| 5,186,797 | 2/1993 | Schlenker et al. ............ 204/146 |
| 5,279,771 | 1/1994 | Lee ............ 252/548 |
| 5,318,677 | 6/1994 | Hirbour et al. ............ 204/141.5 |

FOREIGN PATENT DOCUMENTS

| | | |
|---|---|---|
| 0219789 | 4/1987 | European Pat. Off. |
| 0485161 | 5/1992 | European Pat. Off. |
| 2291607 | 6/1976 | France. |
| 1621664 | 6/1971 | Germany. |
| 2173918 | 10/1986 | United Kingdom. |
| WO9117484 | 11/1991 | WIPO. |

OTHER PUBLICATIONS

IBM Technical Disclosure Bulletin, p. 6588, V25, No. 12, May 1983 Migliore.

IBM Technical Disclosure Bulletin, p. 6588, vol. 25, No. 12, May 1983, M.J. Migliore, "Butyrolactone as a Stripping Solvent in Lift–Off Process".

*Primary Examiner*—James J. Seidleck
*Assistant Examiner*—John M. Cooney, Jr.
*Attorney, Agent, or Firm*—Oblon, Spivak, McClelland, Maier & Neustadt, P.C.

[57] ABSTRACT

A process for removing plastics from microstructures is disclosed. The metallic microstructure is treated with a high-boiling fluid at a temperature above 140° C. for 10 to 90 minutes and subsequently rinsed with water. Suitable fluids include oligomers of ethylene glycol, short-chain diols and dicarboxylic acid esters. Such fluids do not attack the metal and prevent the plastics which are being removed from swelling.

14 Claims, No Drawings

PROCESS FOR REMOVING PLASTICS FROM MICROSTRUCTURES

This application is a continuation of application Ser. No. 08/190,493, filed on Feb. 2, 1994, now abandoned.

BACKGROUND OF THE INVENTION

1. Field of the Invention

The invention relates to a process for removing plastics from microstructures, in particular those microstructures having a large aspect ratio. Structures of this type have structure depths ranging from a few microns to millimeters, with lateral dimensions in the micron range.

2. Discussion of the Background

Microstructures can be produced by various processes, for example by means of the LIGA process, or by micromechanical precision machining. The LIGA process comprises the process steps of lithography, electroforming and casting; it can be used for the precision manufacture of large numbers of microstructures.

The preferred lithography production method is X-ray depth lithography using a radiation-sensitive resist, such as polymethyl methacrylate (PMMA), which is preferably crosslinked. Compared with uncrosslinked PMMA, crosslinked PMMA adheres better to the substrate, is more shape-stable and has more favorable mechanical properties and higher selectivity during development.

During electroforming, a metal or alloy is deposited electrochemically in the primary structures produced by lithography and development. The shape-providing plastic, for example crosslinked PMMA, is subsequently removed from the metallic microstructure in a process step known as delamination. Aggressive chemical solvents are often used for delamination of low-solubility shape-providing plastics; however, chemical modification of the metallic microstructures, which typically comprise, for example, copper, nickel, nickel/cobalt alloy or gold, must be avoided. One such aggressive delamination technique requires fluorination of the low-solubility, shape-providing plastics, for example by means of boiling trifluoroacetic acid, and subsequent dissolution in a mixture of acetone and hydrochloric acid. This treatment causes the plastic to swell, damaging or destroying the metallic microstructure.

It is also known to re-irradiate the shape-providing plastic in a floodlight-like manner after the electroforming step, to increase its solubility; to this end, synchrotron radiation, X-ray radiation or laser radiation is necessary. This process is complex. In the case of moderately high radiation output, this process step is time-consuming; however, the metallic microstructure remains unchanged. At high radiation output, for example high-energy synchrotron radiation, the radiation time is shorter but the surface of the metallic microstructure is modified. Consequent reductions in quality may require complex reworking of the microstructure. Although the metallic microstructures can be covered by masks or inert gas during the irradiation, these steps require complex equipment and production techniques.

It is also known to remove the shape-providing plastic at elevated temperatures and/or in a plasma. However, changes in physical properties, such as hardness and modulus of elasticity of the metals or alloys of the microstructure elements generally occur. Total destruction of the microstructure elements takes place in some areas and chemical reactions take place between the metal of the microstructure elements and the polymer or the ambient atmosphere.

With the aid of the metallic microstructure, microstructure elements are cast from plastic in large numbers, for example by injection moulding, reaction injection moulding or thermoforming. During removal of the microstructure elements made of plastic, the plastic may in the event of a fault remain partly stuck in the metallic microstructure. In this case also, the plastic must be eliminated from the metallic microstructure so that the metallic microstructure can be re-used. For thermoplastics, in particular amorphous plastics, suitable solvents are known. However, partially crystalline plastics are frequently only soluble at elevated temperatures. Also problematic in this case are thermosets, for which there are usually no known suitable solvents, or the known solvents attack the metallic microstructure.

Due to the difficulties encountered during delamination, thermosets—such as crosslinked PMMA—and epoxy resins, silicone rubber and other plastics are rarely employed for casting. On the other hand, plastics of this type are frequently desired for applicational reasons, since they are distinguished by thermal and chemical resistance.

SUMMARY OF THE INVENTION

One object of this invention is to provide a process by which plastics—even low-solubility ones—can be removed from metallic microstructures in a simple and economical manner without impairing the quality of the metallic microstructures. This object is achieved by a process in which the metallic microstructure element is treated at a temperature above 140° C. with a fluid whose boiling point (at atmospheric pressure) is above 130° C.

DETAILED DESCRIPTION OF THE PREFERRED EMBODIMENTS

In order to remove fusible plastics from a metallic microstructure element, the element is treated with a fluid at a temperature in the range from 20 degrees below the melting point to 100 degrees above the melting point of the plastic, and, simultaneously, in the range from 50 degrees below the boiling point to the boiling point of the fluid. In order to remove infusible plastics from a metallic microstructure element, the element is treated with a fluid at a temperature above 140°C. for 10 to 90 minutes and subsequently rinsed with water. During the treatment with a fluid, the microstructure element can either be exposed to either the liquid phase or the vapour phase of the fluid. The fluid can be under super-atmospheric pressure.

It is expedient, during treatment of the metallic microstructure element in the liquid phase of the fluid, to simultaneously input mechanical energy, for example by stirring, ultrasound or megasound.

Suitable fluids include high-boiling liquids, preferably ethylene glycol and oligomers, polymers or derivatives thereof. Propanediol, butanediol, esters of dicarboxylic acids, silicone oil and polyvinyl alcohol are also suitable. Metal salts, such as zinc bromide, cobalt bromide, and silver acetate, and free-radical formers, such as chloronitrosobenzene, benzoyl peroxide and bisazoisobutyronitrile, can be added to the fluid.

For removal of crosslinked PMMA from a metallic microstructure element, the latter is treated, for example, with polyethylene glycol 400 at above 180° C., preferably at from 220° C. to 240° C. For removal of polyoxymethylene from a metallic microstructure element, the latter is treated, for example, with diethylene glycol monobutyl ether at 190° C. or above, preferably between 190° and 220° C.

The process according to the invention has the following advantages:

The production of metallic microstructures by lithography can be carried out using plastics which are otherwise—without use of the process according to the invention—unusable or only of restricted use due to their behavior during delamination.

Casting of a microstructure element from plastic by means of a metallic microstructure can be carried out using plastics which were hitherto unusable or only of restricted use due to the problems encountered during removal of plastic residues from the microstructure.

The quality of the delaminated metallic microstructures and their service lives are considerably better than hitherto.

The delamination of the metallic microstructures is considerably simpler and more economical than when the processes known hitherto are used.

The plastic to be removed exhibits virtually no swelling in the process fluids; this reduces the risk of destruction of the microstructure.

The process fluids present no risks to health and the processes are inexpensive. They are predominantly infinitely miscible with water. They do not attack the metallic microstructure.

The plastic residues present in the fluid do not precipitate even on cooling of the fluid.

The microstructures treated with the fluid are subsequently merely rinsed with demineralized water.

Critical temperatures which result in changes in the material properties of the microstructure elements are avoided.

The fluids used for removal of the plastics can be disposed of without problems.

The process according to the invention is illustrated in greater detail by means of the examples below which are not intended to be limiting.

EXAMPLE 1

Delamination of a Microstructure in Cross-Linked PMMA by Means of Polyethylene Glycol A metallic microstructure of copper which has a height of 135 μm and which is included in crosslinked PMMA (Plexit 60, Rohm, Darmstadt) having a minimum width of 5 μm is treated with polyethylene glycol 400 (Merck, Darmstadt) at 230° C. in a covered vessel. After 65 minutes, the microstructure has fully delaminated. The metallic microstructure exhibits no structural changes and no changes in the copper surface.

EXAMPLE 2

Delamination of a Microstructure in Epoxy Resin by Means of Dibutyl Succinate and Silver Acetate A metallic microstructure comprising micropyramids having a height of greater than 600 μm made from a nickel/cobalt alloy and included in epoxy resin is treated with dibutyl succinate with addition of 100 milligrams of silver acetate per litre at 210° C. in a covered vessel. After 60 minutes, the microstructure has fully delaminated. The metallic microstructure exhibits no structural changes and no changes in the metal surface.

EXAMPLE 3

Cleaning of a Microstructure by Means of Diethylene Glycol Monobutyl Ether

A metallic microstructure with a height of 200 μm made from nickel with lateral dimensions of 50 μm and a minimum width of 8 μm between two walls had been used to cast about 30 microstructure elements from polyoxymethylene and had been contaminated by plastic residues. This structure is cleaned with diethylene glycol mono-butyl-ether at 190° C. in a covered vessel. After 15 minutes, this microstructure is totally free 10 from plastic residues. The metallic microstructure exhibits no structural changes and no changes in the nickel surface.

Obviously, numerous modifications and variations of the present invention are possible in light of the above teachings. It is therefore to be understood that, within the scope of the appended claims, the invention may be practiced otherwise than as specifically described herein.

What is claimed as new and is desired to be secured by LETTERS PATENT of the United States is:

1. A process for removing plastics from a metallic microstructure element, comprising treating a metallic microstructure element having an aspect ratio (height/width) of at least 4 included in a fusible or infusible plastic layer with a fluid consisting essentially of a polar solvent which does not substantially swell the plastic, at a temperature above 140° C.

2. The process according to claim 1, wherein:
said fluid is selected from the group consisting of ethylene glycol or oligomers, polymers or derivatives thereof, propanediol, butanediol, a dicarboxylic acid ester, polyvinyl alcohol and silicone oil.

3. The process according to claim 1, wherein the metallic microstructure element having an aspect ratio (height/width) of at least 4 is treated with polyethylene glycol at a temperature from 180° C. to 240° C.

4. A process for removing plastics from a metallic microstructure element, comprising treating a metallic microstructure element having an aspect ratio (height/width) of at least 4 included in a fusible or infusible plastic layer with a fluid consisting of a polar solvent which does not substantially swell the plastic and a metal salt or a free-radical former, at a temperature above 140° C.

5. The process according to claim 4, wherein said fluid is selected from the group consisting of ethylene glycol or oligomers, polymers or derivatives thereof, propanediol, butanediol, a dicarboxylic acid ester, polyvinyl alcohol and silicone oil.

6. The process according to claim 4, wherein said metal salt is zinc bromide or silver acetate, and said free-radical former is chloronitrosobenzene, benzoyl peroxide or bisazoisobutyronitrile.

7. The process according to claim 1, wherein said metallic microstructure element is treated with said fluid for about 10 to 90 minutes.

8. The process according to claim 7, wherein after treatment with said fluid, said metallic microstructure element is rinsed with water.

9. The process according to claim 1, wherein said fluid is in a liquid state.

10. The process according to claim 1, wherein said fluid is in a vapor state.

11. The process according to claim 4, wherein said metallic microstructure element is treated with said fluid for about 10 to 90 minutes.

12. The process according to claim 11, wherein after treatment with said fluid, said metallic microstructure element is rinsed with water.

13. The process according to claim 4, wherein said fluid is in a liquid state.

14. The process according to claim 4, wherein said fluid is in a vapor state.

* * * * *